United States Patent [19]

Teass, Jr.

[11] 4,156,181
[45] May 22, 1979

[54] RATIO CIRCUIT

[76] Inventor: Horace A. Teass, Jr., 36 Highland Ter., Pleasantville, N.Y. 10570

[21] Appl. No.: 889,093

[22] Filed: Mar. 22, 1978

[51] Int. Cl.² ........................................... G01R 27/02
[52] U.S. Cl. ................................... 324/62; 324/57 R
[58] Field of Search ................ 324/62, 57 R, 59, 60 C

[56] References Cited

U.S. PATENT DOCUMENTS

| | | | |
|---|---|---|---|
| 3,490,039 | 1/1970 | Tsao | 324/62 |
| 3,612,993 | 10/1971 | Tims | 324/62 X |
| 3,836,847 | 9/1974 | Lucas | 324/62 |
| 4,109,196 | 8/1978 | Carmody | 324/62 |

*Primary Examiner*—Stanley T. Krawczewicz
*Attorney, Agent, or Firm*—Peck & Peck

[57] ABSTRACT

A circuit for indicating the ratio of an unknown part value to a known part value, or the percentage error between an unknown part value and a known part value, or the direct value of an electrical part to be measured, has a first operational amplifier for developing a voltage proportional to the ratio of an unknown part value to a known part value and a second operational amplifier for subtracting a predetermined amount from said ratio voltage so that the resultant output from said second amplifier provides the desired percentage error of the unknown part value to that of known part value.

4 Claims, 1 Drawing Figure

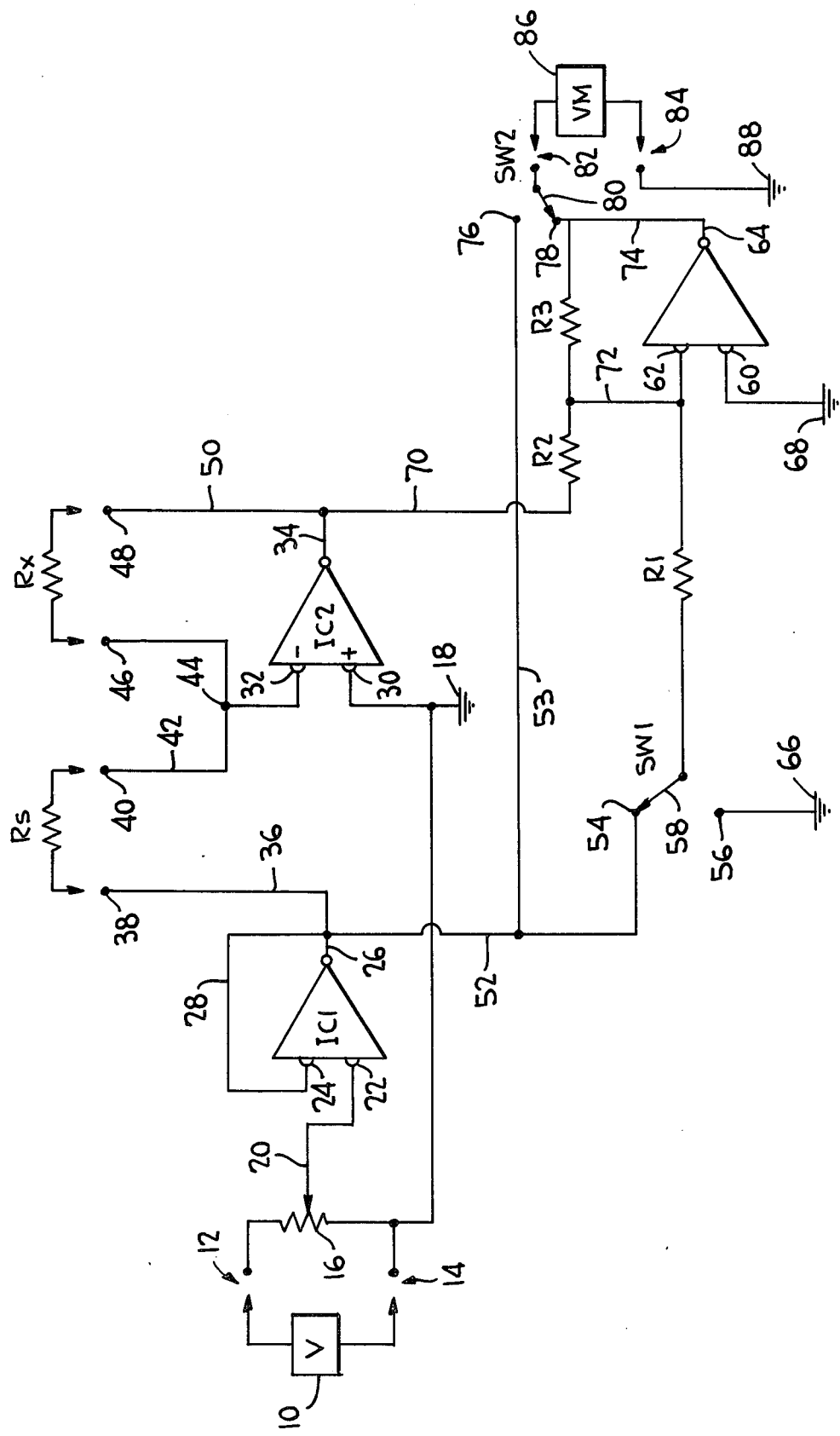

RATIO CIRCUIT

BACKGROUND OF THE INVENTION

The present invention relates generally to electrical measuring systems and, more particularly, to a ratio circuit for measuring and indicating the ratio of an unknown component value to a known component value, or for measuring and indicating the value of an unknown electrical component.

The use of Wheatstone bridges in laboratory and production work to determine the values and accuracy of electrical components is well known. However, such bridges require the operator to apply nulling techniques and a user wanting to know percentage error must compute accuracy. This presents an undesirable cost burden to even small volume measurements.

Now systems for measuring directly values of resistance, capacitance or inductance are expensive and complex, and do not provide direct readings in percentage error. In practice the value of an electrical component is measured as plus or minus a value. When testing multiple like components, it is desirable to be concerned with the accuracy of a particular component within specified limits. For many reasons including convenience to unskilled operators, it is desirable to have such an instrument read directly in percentage error so that the operator need know only the tolerance limits to accept or reject tested components.

SUMMARY OF THE INVENTION

Accordingly, it is an object of the present invention to provide a ratio circuit for measuring directly in percentage error between a standard component and a tested component.

It is a further object of this invention to provide a circuit for measuring directly the value of an unknown resistance, capacitance or inductance.

The present invention is summarized in that a standard or known component value and an unknown component value are connected in circuit with an operational amplifier to first develop a ratio of voltage of the unknown component value to the known standard value, and that ratio voltage is then fed to a second operational amplifier along with a unity voltage whereby the second amplifier substracts the unity voltage from the ratio voltage to produce a direct reading of the percentage between the unknown component value and the known component value.

BRIEF DESCRIPTION OF THE DRAWING

The drawing is a schematic diagram of the preferred embodiment of the invention.

DESCRIPTION OF THE PREFERRED EMBODIMENT

The present invention is embodied in a measuring and testing system illustrated schematically in the drawing. A stable source of AC voltage 10 is applied across input terminals 12 and 14 and potentiometer 16. Terminal 14 is connected to circuit common at 18. Potentiometer arm 20 is connected to the noninverting input 22 of a linear operational integrated circuit IC1. Inverting input 24 and output 26 of IC1 are connected through conductor 28, thus providing a very low source resistance as its output 26. IC1 (as do IC2 and IC3) receives its DC power from a suitable power supply which is not shown.

IC1 output 26 is connected through conductor 36, terminal 38, type standard Rs, (an electrical part of known value) terminal 40, conductor 42, terminal 46, Rx, an electrical component whose value is to be measured or checked, terminal 48 and conductor 50 to output 34 of a linear operational integrated circuit amplifier IC2. IC2 has an inverting input 32, which is connected to the junction 44 between components Rs and Rx, and a noninverting input 30 which is connected to circuit common at 18.

Type standard Rs may be a resistor, capacitor or inductor, or any combination of these elements which is selected as the standard of the component or part to be measured or checked. The potentiometer arm 20 is adjusted to produce a convenient voltage, such as 1.000 volts, at output 26 of IC1. For purposes of illustration, assume that the voltage at output 26 is 1.00 volts, Rs is a resistance of 100 Ohms and Rx is an unknown resistance of 110 ohms. By operation of IC2, the voltage appearing at its output 34 will be $-1.10$ volts.

IC1 output 26 is connected through conductor 52, terminal 54 and pole 58 of switch SW1, and resistor R1 to the inverting input 62 of a linear operational integrated circuit amplifier IC3. Normally switch SW is connected to terminal 54, but it can be made to connect IC3 inverting input 62 to circuit common at 66 through switch terminal 56. IC3 noninverting input 60 is connected to ground at 68. IC1 output 26 may also be connected to the system output terminal 82 through conductors 52 and 53, terminal 76 and pole 80 of switch SW2.

Output 34 of IC2 is connected through conductor 70, resistor R2 and conductor 72 to inverting input 62 of IC3. Output 64 of IC3 is connected through conductor 74, resistor R3 and conductor 72 to inverting input 62. In its normal position pole 80 of switch SW2 is at terminal 78 to connect IC3 output 64 to the system output terminal 82.

An output meter such as a digital volt meter 86 is connected across system output terminals 82 and 84, and terminal 84 is connected to circuit common at 88.

Resistors R2 and R3 must equal each other and R1, for convenience, is selected to equal R2 or R3. With this design, and continuing with the above illustration, IC2 output at terminal 34 of $-1.10$ volts is fed through resistor R2 into inverting input 62 of IC3. Also the $+1.00$ volts appearing at IC1 output 26 is fed through resistor R1 into inverting input 62. Since R2 equals R3, the operation of IC3 produces an output at terminal 64 of $+0.10$ volts, which is a direct indication of the 10 percent variance between the type standard Rs (100 ohms) and the unknown part Rx (110 ohms). Where the unknown Rx equals the type standard Rs, a digital output meter will produce a reading of 0.000 indicating no percent error of unknown component as to type standard. The operation of IC2 produces the ratio of the unknown value Rx to the standard value Rs, while IC3 operates to substract out the 1 volt value to provide a reading of percentage error of unknown part value Rx to that of standard part value Rs.

The low source resistance from IC1 provides a near zero base so as to have the ratio operation of IC2 substantially determined by Rx and Rs. Likewise, IC1 provides the required base for proper operation of IC3.

It is apparent that the present invention can also operate with pure capacitor or inductor elements or mixed components of resistors, capacitors or inductors and produce the same results. Additionally, a voltage comparator may be substituted for output meter 86 whereby the comparator threshhold could be set to automatically detect components which measure or test out of tolerance limits and, by additional mechanical means, physically sort the tested components according to tolerance limits.

As a self-calibrating feature, it is convenient for purposes of calibration, recalibration or verification to display precisely the voltage selected by potentiometer arm 20 and appearing at IC1 output 26. In this manner the digit 1.00 may be displayed. This is achieved by throwing pole 80 switch SW2 to terminal 76 so that IC1 output 26 is connected directly to digital voltmeter 86. Thereafter potentiometer arm 20 may be adjusted as required.

The above described substracting action of IC3 may be eliminated by connecting switch SW1 pole 58 to terminal 56. In this case where 1 volt has been fed into the system, then by using a standard calibrated resistor of typically 100 or 1000 ohms, the output voltage at IC3 output terminal 64 will be the basis of a precise ratio. For example, if Rs equals 1000 ohms and Rx equals 2013 ohms, the output meter 86 would indicate 2.013 and the user would directly know the value of Rx. Thus, a very simple quality control system can provide both percentage error between known and unknown values or direct indications of unknown values.

Inasmuch as the present invention is subject to many variations, modifications and changes in detail, it is intended that all matter contained in the foregoing description or shown in the accompanying drawing shall be interpreted as illustrative and not in a limiting sense.

What is claimed is:

1. A circuit for indicating the percentage difference between an unknown electrical part value and a known electrical part value comprising:
    a first operational amplifier means having inverting, noninverting and output terminals for providing a unity output voltage at said output terminal and a low source impedance;
    a second operational amplifier having inverting, noninverting and output terminals;
    a standard electrical part having a known impedance value;
    a test electrical part having an unknown impedance value, said standard and test parts being connected in series with each other between said first amplifier output and said second amplifier output;
    a connection between said second amplifier inverting input terminal and the junction between said standard and test parts, whereby said test part is in a feed back circuit for said second amplifier and said standard part is in a input circuit for said second amplifier, and said second amplifier produces an output voltage proportional to the ratio of said test part value to said standard part value;
    a third operational amplifier having inverting, noninverting and output terminals, wherein said first, second and third amplifier output terminals are connected to said third amplifier inverting terminal, whereby said third amplifier operates to produce an output voltage indicative of any percentage difference between said test part value and said standard part value.

2. The Invention as recited in claim 1 further comprising a switch and a meter wherein said switch is connected to selectively connect either said first amplifier output or said third amplifier output to said meter.

3. The Invention of claim 1 further comprising switch means for selectively disconnecting said first amplifier output from said third amplifier inverting input.

4. The Invention of claim 1 wherein said third amplifier substracts the output of said first amplifier from the output of said second amplifier.

* * * * *